United States Patent [19]

Tuttle et al.

[11] Patent Number: 5,779,839
[45] Date of Patent: Jul. 14, 1998

[54] METHOD OF MANUFACTURING AN ENCLOSED TRANSCEIVER

[75] Inventors: Mark E. Tuttle; John R. Tuttle, both of Boise; Rickie C. Lake, Eagle, all of Id.

[73] Assignee: Micron Communications, Inc., Boise, Id.

[21] Appl. No.: 947,681

[22] Filed: Sep. 26, 1997

Related U.S. Application Data

[63] Continuation-in-part of Ser. No. 168,909, Dec. 17, 1993, Pat. No. 5,497,140, Ser. No. 489,185, Jun. 9, 1995, and a continuation of Ser. No. 8,529, Jan. 25, 1993, Pat. No. 5,326,652, and Ser. No. 602,686, Feb. 16, 1996, abandoned, which is a continuation of Ser. No. 137,677, Oct. 14, 1993, abandoned, which is a continuation-in-part of Ser. No. 899,777, Jun. 17, 1992, abandoned, said Ser. No. 168,909, is a continuation of Ser. No. 928,899, Aug. 12, 1992, abandoned, said Ser. No. 489,185, is a continuation of Ser. No. 123,030, Sep. 14, 1993, Pat. No. 5,448,110.

[51] Int. Cl.$^6$ ........................................................ B32B 31/00
[52] U.S. Cl. ........................ 156/213; 29/855; 156/308.4
[58] Field of Search ................... 156/64, 213, 308.4; 29/854, 855, 856; 364/708, 712; 437/235

[56] References Cited

U.S. PATENT DOCUMENTS

| | | | |
|---|---|---|---|
| 3,706,094 | 12/1972 | Cole et al. | 343/6.5 SS |
| 3,750,167 | 7/1973 | Gehman et al. | 343/6.5 SS |
| 3,780,368 | 12/1973 | Northeved et al. | 343/6.5 SS |
| 3,832,530 | 8/1974 | Reitboeck et al. | 235/61.11 H |
| 3,849,633 | 11/1974 | Reitboeck et al. | 235/61.12 N |
| 4,049,969 | 9/1977 | Salonimer et al. | 250/458 |
| 4,262,631 | 4/1981 | Kubacki | 118/723 |
| 4,331,957 | 5/1982 | Enander et al. | 343/6.8 R |
| 4,399,441 | 8/1983 | Vaughan et al. | 343/6.5 SS |
| 4,418,411 | 11/1983 | Strietzel | 371/67 |
| 4,484,355 | 11/1984 | Henke et al. | 455/76 |
| 4,680,724 | 7/1987 | Sugiyama et al. | 364/708 |
| 4,727,560 | 2/1988 | Van Zanten et al. | 377/60 |
| 4,746,618 | 5/1988 | Nath et al. | 437/2 |
| 4,746,830 | 5/1988 | Holland | 310/313 D |
| 4,756,717 | 7/1988 | Sturgis et al. | 29/623.3 |
| 4,777,563 | 10/1988 | Teraoka et al. | 361/395 |
| 4,827,110 | 5/1989 | Rossi et al. | 235/376 |
| 4,827,395 | 5/1989 | Anders et al. | 364/138 |
| 4,854,328 | 8/1989 | Pollack | 128/736 |
| 4,882,294 | 11/1989 | Christenson | 437/90 |
| 4,918,631 | 4/1990 | Hara et al. | 364/708 |
| 4,942,327 | 7/1990 | Watanabe et al. | 310/313 R |
| 5,008,776 | 4/1991 | Queyssac | 361/392 |
| 5,023,573 | 6/1991 | Adam | 333/17.2 |
| 5,095,240 | 3/1992 | Nysen et al. | 310/313 R |
| 5,148,504 | 9/1992 | Levi et al. | 385/14 |
| 5,153,710 | 10/1992 | McCain | 357/75 |

(List continued on next page.)

OTHER PUBLICATIONS

Keith Casson and Kelly Habeck, "High Temperature Packaging: Flip Chip on Flexible Laminate," Jan. 1992, Surface Mount Technology pp. 19–20.

R. Wayne Johnson, "Polymer Thick Films: Technology and Materials," Circuits Manufacturing Jul. 1982.

(List continued on next page.)

*Primary Examiner*—David A. Simmons
*Assistant Examiner*—Paul M. Rivard
*Attorney, Agent, or Firm*—William R. Bachand; Robert J. Stern

[57] ABSTRACT

The present invention teaches a method of manufacturing an enclosed transceiver, such as a radio frequency identification ("RFID") tag. Structurally, in one embodiment, the tag comprises an integrated circuit (IC) chip, and an RF antenna mounted on a thin film substrate powered by a thin film battery. A variety of antenna geometries are compatible with the above tag construction. These include monopole antennas, dipole antennas, dual dipole antennas, a combination of dipole and loop antennas. Further, in another embodiment, the antennas are positioned either within the plane of the thin film battery or superjacent to the thin film battery.

10 Claims, 12 Drawing Sheets

U.S. PATENT DOCUMENTS

| | | | |
|---|---|---|---|
| 5,166,502 | 11/1992 | Rendleman et al. | 235/492 |
| 5,302,954 | 4/1994 | Brooks et al. | 342/44 |
| 5,313,211 | 5/1994 | Tokuda et al. | 342/50 |
| 5,340,968 | 8/1994 | Watanabe et al. | 235/380 |
| 5,448,110 | 9/1995 | Tuttle et al. | 257/723 |

OTHER PUBLICATIONS

Ken Gilleo, "Using SM Devices On Flexible Circuitry," Mar. 1986, Electri-onics, pp. 20–23.

C.W. Pierce; "Epitaxy"; 1988, 1983; p.55; in VLSI Technology; S.M. Sze, editor; McGraw–Hill Book Co.

J. Rice; "Silica–coated films to go commercial in '93"; from Oct. 93 issue of Food Processing.

R.J. Nelson; "Plasma Enhanced Chemical Vapor Deposition of $SiO_x$ Coatings for Gas Diffusion Barrier Enhancement of Flexible Polymerized Compounds"; presented Jul. 9, 1993 at Society for Research of Polymerized Compound Surfaces, Fukui City, Japan.

A. Rizika; "Vapor Coating with $SiO_x$: The Flexible Glass Barrier"; presented Nov. 8–11, 1992 at Pack Expo '92 Conference, Chicago, Ill.

"Airco coating technology announces contracts in its toll coating program"; Mar. 26, 1993 press release from Airco Coating Technology, Fairfield, CA.

J.T. Felts; "Transparent Barrier Coatings Update: Flexible Substrates"; Airco Coating Technology, Concord, CA. (Publication date not shown; mailed by Airco to Mark Tuttle Sept. 21, 1993).

J.T. Felts; "Transparent Gas Barrier Technologies"; Airco Coating Technology, Concord, CA. (Publication date not shown; mailed by Airco to Mark Tuttle Sep. 21, 1993).

P. Ang; "Progress of QLF Barrier Coating"; Airco Coating Technology, Concord, CA. (Publication date not shown; mailed by Airco to Mark Tuttle Sept. 21, 1993).

Untitled page stating moisture barrier performance of QLF barrier coating on 12μ polyester film, Sample ID #R9–930316. (Publication date not shown; mailed by Airco to Mark Tuttle Sept. 21, 1993).

5,779,839

METHOD OF MANUFACTURING AN ENCLOSED TRANSCEIVER

CROSS-REFERENCE TO RELATED APPLICATION

This application is a continuation of application Ser. No. 08/602,686, filed Feb. 16, 1996, now abandoned, which is a continuation of application Ser. No. 08/137,677, filed Oct. 14, 1993, now abandoned, which is a continuation-in-part of application Ser. No. 07/899,777, filed Jun. 17, 1992, now abandoned. This application is also a continuation of application Ser. No. 08/008,529, filed Jan. 25, 1993, now U.S. Pat. No. 5,326,652. This application is also a continuation-in-part of application Ser. No. 08/168,909, filed Dec. 17, 1993, now U.S. Pat. No. 5,497,140, which is a continuation of application Ser. No. 07/928,899, filed Aug. 12, 1992, now abandoned. This application is also a continuation-in-part of application Ser. No. 08/489,185, filed Jun. 9, 1995, now pending, which is a continuation of 08/123,030, filed Sep. 14, 1993, now U.S. Pat. No. 5,448,110.

TECHNICAL FIELD

The present invention relates generally to a process for manufacturing an enclosed transceiver, such as a radio frequency identification ("RFID") tag.

BACKGROUND

In the field of radio frequency identification ("RFID"), communication systems have been developed utilizing relatively large packages whose size is on the order of that of a cigarette package or a substantial fraction thereof, and generally speaking, have been fabricated using hybrid circuit fabrication techniques. These relatively large electronic packages have been affixed, for example, to railroad cars to reflect RF signals in order to monitor the location and movement of such cars.

With respect to an enclosed electronic apparatus, a system for handling baggage in an airport terminal is a typical application. Such a system incorporates radio frequency identification (RFID) between interrogators and transceivers. Further, each baggage tag is an enclosed, battery operated transceiver.

Other smaller passive RFID packages have been developed for applications in the field of transportation, including the tracking of automobiles. These packages include reflective systems of the type produced by Amtech Inc. of Dallas, Tex. However, these reflective passive RFID packages which operate by modulating the impedance of an antenna are inefficient in operation, require large amounts of power to operate, and have a limited data handling capability.

In still other applications of article location and tracking, such as in the postal service or in the field of airline baggage handling and transport, it has not been practical or feasible to use the above relatively large and expensive RFID hybrid packages on smaller articles of transport such as letters, boxed mail shipments or airline luggage. Accordingly, in these latter areas of transport monitoring, as well as many other areas such as inventory control of stored articles, article location and tracking methods have traditionally employed bar code identification and optical character recognition (OCR) techniques which are well known in the art.

Bar code identification and OCR techniques are labor intensive and may, for example, require several airline employees or postal workers to physically manipulate the article and/or the bar code readers to read these bar codes before the transported article reaches its final destination. In addition, the cost of bar code readers and optical character readers is high, limiting the number of locations at which these readers can be used. Furthermore, both bar code readers and optical character readers tend to be highly unreliable.

In yet further and somewhat unrelated fields of: (1) animal tracking and (2) plant tracking, other types of passive RFID tags have been developed by Hughes/IDI/Destron of Irvine, Calif. These tags utilize a coil wrapped around a ferrite core. Such passive RFID tags have a very limited range, on the order of nine (9) inches, have a very limited data handling capability, and are not field programmable. In addition, these tags are limited in data storage capacity and are slow in operation.

In view of the problems described above and related problems that consequently become apparent to those skilled in the applicable arts, the need remains for enclosed electronic apparatus including transceivers wherein the enclosure is inexpensive, readily manufactured in high volume, appropriate in size for use as a stamp, label, or tag, and, in the case of transceivers, operable over distances of several hundred feet without regard for the spacial orientation of the enclosure.

SUMMARY

The general purpose and principal object of the present invention is to provide a novel alternative approach to all of the above prior art RFID, OCR, and bar code type location tracking and data storage systems. This new approach as described and claimed herein represents a fundamental breakthrough in the field of article transport control in a wide variety of fields, of which the fields of airline baggage transport, delivery of parcels and mail, and inventory control are only three examples.

To accomplish this purpose and object, we have invented and developed a new and improved radio frequency identification device, an associated electrical system, and a method for communicating with a remote RFID device from a local interrogator and controller. The size of this new device will typically be on the order of one inch square and 0.03 inches thick, or only slightly larger and slightly thicker than a postage stamp. This device includes, in combination, an integrated circuit (IC) which is mounted in an approximately one inch square package and is encapsulated, for example laminated, in a flexible or rigid thin film material. This material may also include a suitable adhesive backing for reliably securing the package to an outer surface or printed label of an article of interest. The IC includes therein a receiver section for driving suitable control logic and memory for decoding and storing input information such as an identification number, the baggage owner's name, point of origin, weight, size, route, destination, and the like. This memory includes, but is not limited to, PROMs, EPROMs, EEPROMs, SRAMs, DRAMs, and ferroelectric memory devices. The IC also includes a transmitter section therein operative for transmitting this information to an interrogator upon subsequent IC interrogation. An RF antenna is placed in a desired geometrical configuration (for example, monopole, dipole, loop, bow-tie, or dual-dipole) and incorporated within or on the thin film material and adjacent to the IC in an essentially two dimensional structure, neglecting the approximately 30 mil thickness dimension of the completed structure.

Advantageously, a thin battery is connected to the IC for providing power to the IC. The IC also incorporates circuitry to allow for operation in a sleep mode during transit and in storage in order to conserve power. Thus, at shipment points of origin, destination, and locations in transit, an operator may encode data into the IC or interrogate the IC by signaling the IC from a remote location to thereby "wake up" the IC without engaging in any hands-on operation.

In a preferred embodiment of the invention, the integrated circuit receiver and transmitter are operated in a spread spectrum mode and in the frequency range of 200 Mhz to 10 GHz, with the range of 800 MHz to 8 GHz being the range of most importance. This operation has the effect of avoiding errors or improper operation due to extraneous signal sources and other sources of interference, multipathing, and reflected radiation from the surrounding environment.

Accordingly, it is a further object of this invention to provide an RFID electronic device of the type described and method of fabricating such device.

Another object of this invention is to provide an RFID system and method of operation of the type described which utilizes RF transmitting and receiving sections on a single IC. Such a system has applications for tracking people or articles in both storage and transit.

Another object of this invention is to provide an electronic device of the type described which does not include bulky hybrid circuits, use modulation techniques described above for passive RFID tags, nor require scanning of bar codes, bar code readers, optical character readers, or especially clean operating environments.

Another object of this invention is to provide an electronic device of the type described which may be manufactured using integrated circuit fabrication and packaging processes.

Another object of this invention is to provide an electronic device of the type described which may be reliably and economically manufactured at high yields and at a high performance to price figure of merit.

Another object of this invention is to provide an RFID device of the type described which is field writable and has a transmission range greater than five (5) feet.

Another object of this invention is to provide a novel assembly process for manufacturing the RFID electronic device described herein.

Another object is to provide a manufacturing process of the type described which is conducive to high speed automation.

Another object is to provide an enclosed electronic device of the type described which is further conducive to high speed product usage, since these RFID devices may be supplied to the customer in a tape and reel format, a fan fold format, or a sheet format.

Another object of this invention is to provide an RFID device of the type described which may be powered with the use of an RF coil and capacitor and without the use of a battery. Such device is also referred to herein as the "passive" device embodiment. However, the term "passive" refers only to the fact that no battery is used, whereas the electrical circuitry on the IC is indeed active while being powered by the RF coil and capacitor combination.

Another object of this invention is to provide a non-contact method of object and person detection and location which can serve as a replacement for metal-to-metal contact in smart card applications and as a replacement for magnetic strip, bar code, and other types of contact-powered electronics. This novel method of object detection and location represents a significant saving of time and manual effort. For example, consider the time and effort involved when a person must first remove a smart card from a pocket or billfold and then insert the card in a card reader device before being allowed entry into a secured area within a building.

Another object of this invention is to provide an electronic device, system, and communication method of the type described which represents, in novel combination, a fundamental breakthrough in many diverse fields of article shipment, including the parcel post and postal fields, the airline industry, inventory control for many manufacturing industries, security, waste management, personnel, and the like.

Accordingly, an enclosed electrical assembly of the present invention includes: a rigid or flexible thin film support member having an integrated circuit (IC) disposed thereon and an antenna incorporated within the IC or positioned adjacent to the IC within a predetermined area of the thin support member; means on the IC for receiving and encoding data relating to the article being stored or shipped; and means on the IC for reading the stored data and transmitting this data to an operator at a remote location.

According to a first aspect of such an assembly, a base member and a cover member each having conductive patterns developed thereon connect the IC in series with two thin film batteries. By arranging two batteries with the IC, no substantial current flows through a laminated or folded portion of the assembly. Smaller signal levels, lower power operation, and longer useful life of the assembly results.

According to another aspect, antenna coupling is also provided to the IC without current flow through a laminated or folded portion of the assembly. Greater sensitivity in receiving and lower losses in transmitting result.

According to another aspect of the present invention, an RFID device has two modes of operation are provided with a wake-up circuit. The wake-up circuit senses in-band energy and switches from a sleep mode to an operating (waked) mode. The sleep mode being useful during transit and storage of the RFID device to conserve battery power.

According to another aspect of such an RFID device, the IC includes receiver and transmitter sections characterized by spread spectrum modulation. Use of spread spectrum modulation reduces data transmission and reception errors, reduces the possibility of improper operation in response to extraneous signal sources, reflected radiation from a surrounding noisy environment, and other interference. Battery power is thereby conserved.

According to another aspect of the present invention, the enclosure includes an adhesive on an outer surface thereof. The adhesive permits reliable and convenient securing of a device of the present invention to an article being transported or stored.

According to yet another aspect of the present invention, by enclosing a transceiver in film, an extremely light weight, durable, and thin package results. Such a package is appropriate for use in replacement of or in conjunction with the conventional handwritten label, conventional hand-cancelled or postage-metered stamp, and the conventional baggage tag.

According to another aspect of the present invention, the frequencies of radio communication, modulation scheme, geometry of the antenna, capacity of the battery, and electrical properties of the enclosure cooperate for omnidirectional communication between an enclosed transceiver of the present invention and a distant interrogator. No manual manipulation of the interrogator or transceiver is required for area-wide communication such as confirming the contents of a delivery vehicle or verifying inventory in place, to name a few examples.

According to an aspect of another embodiment of the present invention, a plurality of transceivers are enclosed and laminated between a pair of films. One side of one of the films has adhesive capability. The transceivers are separated and arranged on a backing. A roll or tape of the backing having transceivers removably attached thereto is enclosed in an RF tight dispenser. The dispenser provides convenient access to unprogrammed transceivers for use on articles to be shipped. When removed from the dispenser, a transceiver communicates with an interrogator in the area for establishing transceiver identity, shipping authorization, destination or storage criteria, date of issue, and similar information. By shielding transceivers within the dispenser from wake-up signals, battery power is conserved.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

In each functional block diagram, a single line between functional blocks represents one or more signals. A person of ordinary skill in the art will recognize that portions of the perspective views and cross-sectional views are enlarged for clarity.

DESCRIPTION

Figure 1A:
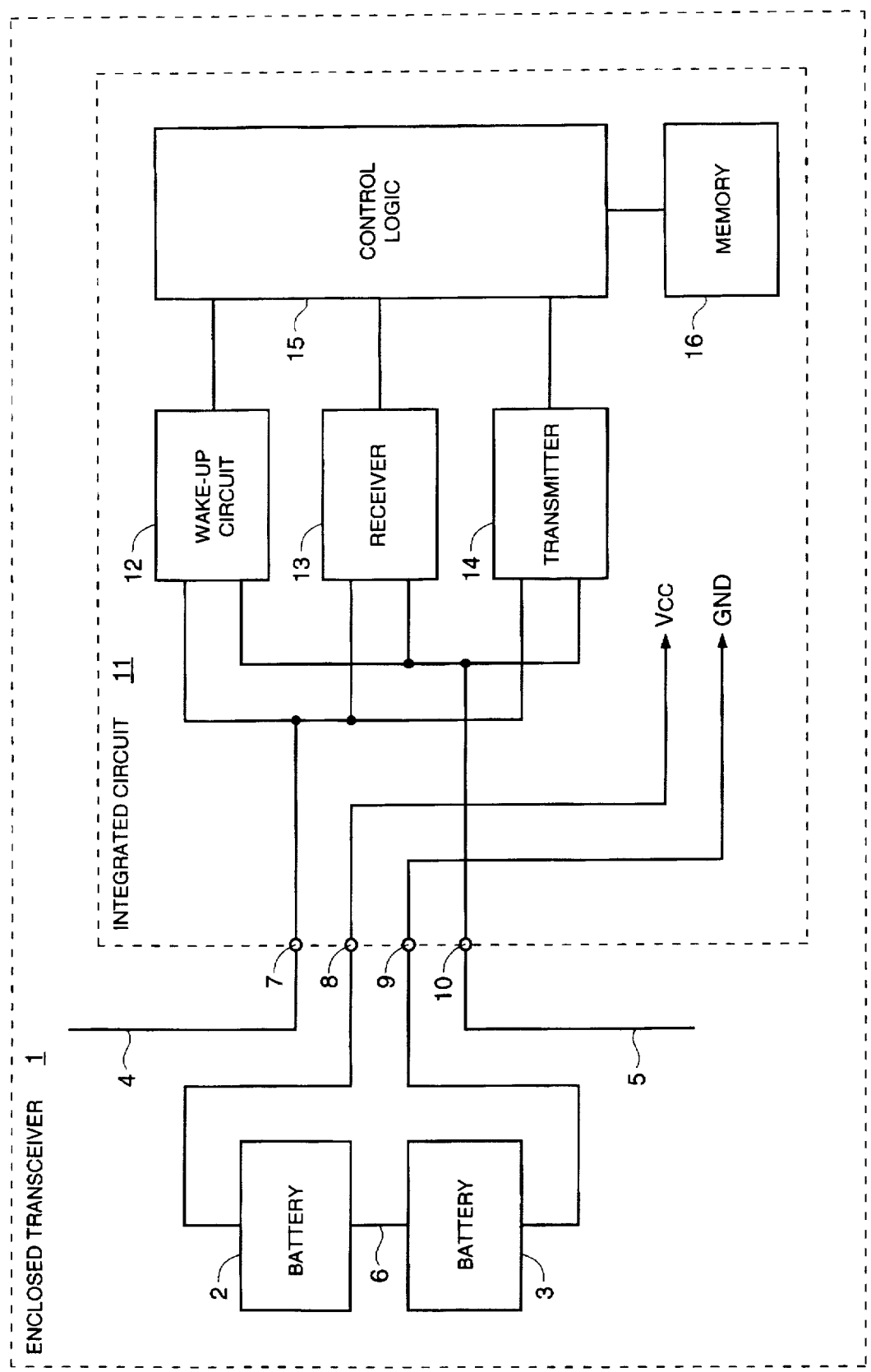
FIG. 1A and FIG. 1B are functional block diagrams of enclosed transceivers of the present invention.
Figure 1B:
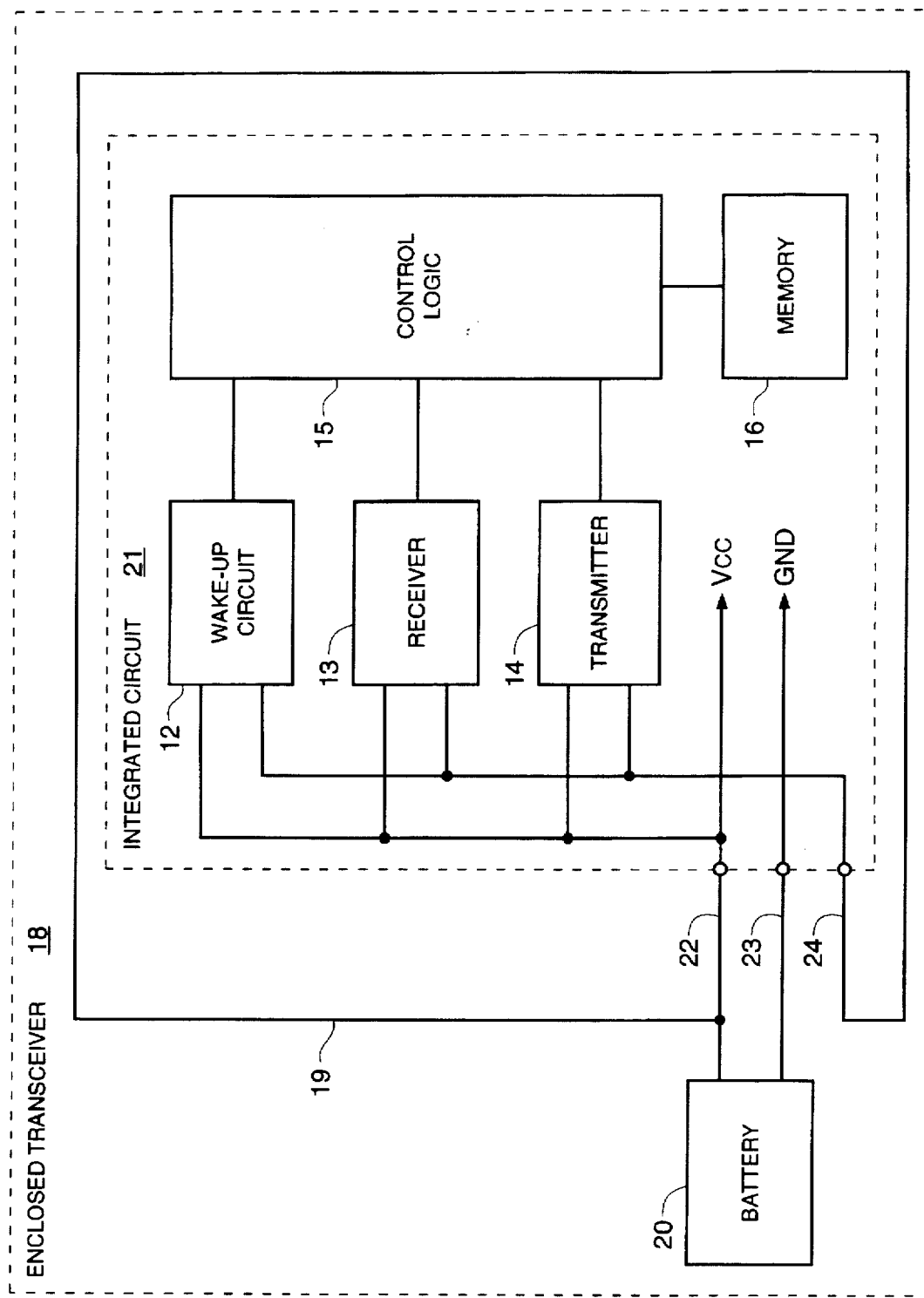

FIG. 1A and FIG. 1B are functional block diagrams of enclosed transceivers of the present invention. Enclosed transceiver 1 includes a pair of batteries 2 and 3, a dipole antenna 4 and 5, and an integrated circuit (IC) 11. Batteries 2 and 3 are in series connection through line 6 and cooperate as powering means for supplying power to IC 11 through lines 8 and 9. As will be discussed below, the series connection of two batteries simplifies conductor patterns in the enclosure. IC 11 is a four terminal device operating as communicating means for transmitting and receiving radio signals. Dipole antenna 4 and 5 couples radio signals between IC 11 and the communications medium which separates enclosed transceiver 11 from an interrogator, not shown. The interrogator is located up to 400 feet from enclosed transceiver 11.

Integrated circuit 11 is a transceiver including wake-up circuit 12, receiver 13, transmitter 14, control logic 15, and memory 16. Each of these functional circuits receives power signals VCC and GND on lines 8 and 9. When a received signal has substantial in-band energy as detected by wake-up circuit 12, control logic 15 enables receiver 13 for receiving and decoding a radio signal on antenna 4 and 5. Received data is provided by receiver 13 to control logic 15. Control logic 15 writes received data into memory 16. Control logic 15 also processes (i.e. decodes, tests, or edits) the received data with data stored in memory 16 and determines whether a response transmission is appropriate and the content of such a response. If a response is appropriate, control logic 15 reads transmit data from memory 16 and enables transmitter 14 for sending the transmit data as a second radio signal on antenna 4 and 5. Control logic 15 operates as a controller for reading data from and writing data to memory 16. Antenna 4 and 5 matches the medium to the receiver and to the transmitter for improved receiver sensitivity, and reduced transmission losses. Dipole antenna 4 and 5 has a toroidal antenna pattern with a null along the axis of the toroid.

FIG. 1B is a functional block diagram of an alternate enclosed transceiver of the present invention. Like numbered elements correspond to elements already described with reference to FIG. 1A. Enclosed transceiver 18 includes loop antenna 19, battery 20, and integrated circuit 21. Loop antenna 19 provides near omnidirectional communication capability as will be discussed with reference to FIG. 11.

Battery 20 is connected to antenna line 22 to reduce the number of terminals required to connect integrated circuit 21 into enclosed transceiver 18 and to improve the omnidirectional nature of the antenna pattern. A novel enclosure implements this connection to be discussed below. Integrated circuit 21 is a three terminal device providing the same functions as integrated circuit 11 already described with reference to FIG. 1A.

As an example of a data call-up operation, consider the events surrounding checking baggage or mailing a package.

When an enclosed transceiver of the present invention is placed on the outside surface of a piece of luggage by the airlines or on a package for shipment by the postal service, an airline agent or postal worker operates an interrogator. The interrogator transmits information to receiver 13 via an RF communication link concerning data such as the owner's name, an ID number, point of origin, weight, size, route, destination, amount of postage prepaid, billing information for debit, postage, handling, or storage costs due, time stamp, and the like. This received data is coupled to control logic 15 for processing, encoding, and storage in memory 16. Stored data is made available for call up by an interrogator at one or more points along the shipment route.

For example, upon reaching a point of shipment destination, an interrogator calls up stored data and uses it at the point of destination for insuring that the item of luggage or shipment is most assuredly and efficiently put in the hands of the desired receiver at the earliest possible time. Specifically, an interrogator at the destination point sends interrogation signals to the enclosed transceiver 1 where they are received by antenna 4 and 5 and first processed by sleep/wake up circuit 12. Wake-up circuit 12 operates to bring integrated circuit 11 out of a "sleep" mode into a "waked" mode wherein receiver 13 receives and decodes signals to provide received data to control logic 15.

With integrated circuit 11 now in "waked" mode, memory 16 is read by control logic 15 to call-up transmit data, i.e. the above six pieces of information relating to the shipped article. Control logic 15 then couples the transmit data to transmitter 14 and enables transmitter 14 for sending transmit data to the interrogator.

Receiver 13 and transmitter 14 preferably employ one of the well known spread spectrum modulation techniques including for example: (1) direct sequencing, (2) frequency hopping, (3) pulsed FM or chirped modulation, (4) time hopping, or (5) time-frequency hopping used with pulse amplitude modulation, simple amplitude modulation or binary phase shift keying.

The communication circuitry of an interrogator (not shown) is designed to conform to the modulation technique, message encoding, and modes of operation described for the enclosed transceivers of the present invention. Interrogator design is understood by those skilled in the art and, therefore, is not described herein.

Figure 2:
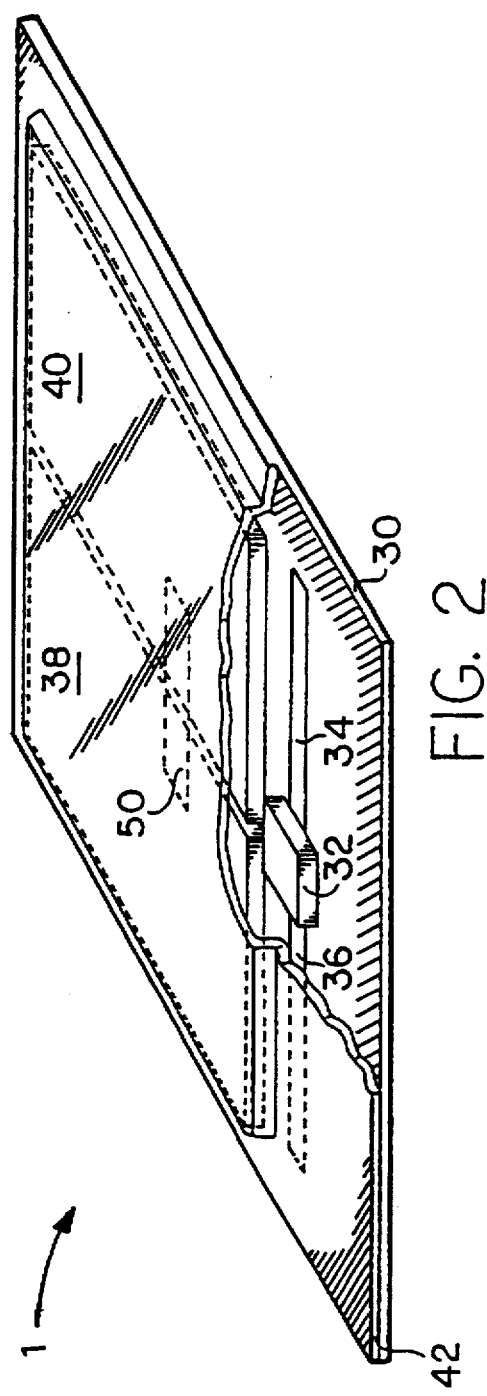
FIG. 2 is a perspective view of an enclosed transceiver as shown in FIG. 1A.

FIG. 2 is a perspective view of an enclosed transceiver as shown in FIG. 1A. Enclosed transceiver 1 includes a base support layer 30 upon which an integrated circuit 32 is disposed on the near end of layer 30 and connected to a dipole antenna consisting of a pair of conductive strips 34 and 36 extending laterally from IC 32. These conductive strips 34 and 36 will typically be screen printed on the upper surface of base support layer 30.

A pair of rectangularly shaped batteries 38 and 40 are positioned as shown adjacent to IC 32 and are also disposed on the upper surface of base support member 30. Rectangular batteries 38 and 40 are electrically connected in series to power IC 32 in a manner more particularly described below. Assembly of enclosed transceiver 1 is completed by the folding over of an outer or upper cover member 42 which is sealed to the exposed edge surface portions of the base member 30 to thereby provide an hermetically sealed and completed package. When cover member 42 is folded over onto base member 30, conductive strip 50 is attached to batteries 38 and 40 using conductive epoxy. Conductive strip 50 provides means for coupling a pole of battery 38 to a pole of battery 40; thus accomplishing the series electrical connection of batteries 38 and 40. Integrated circuit 32 has transmitter, memory, control logic, and receiver stages therein and is powered by batteries 38 and 40 during the transmission and reception of data to and from an interrogator to provide the interrogator with the various above information and identification parameters concerning the article, animal or person to which the enclosed transceiver is attached.

Figure 3:
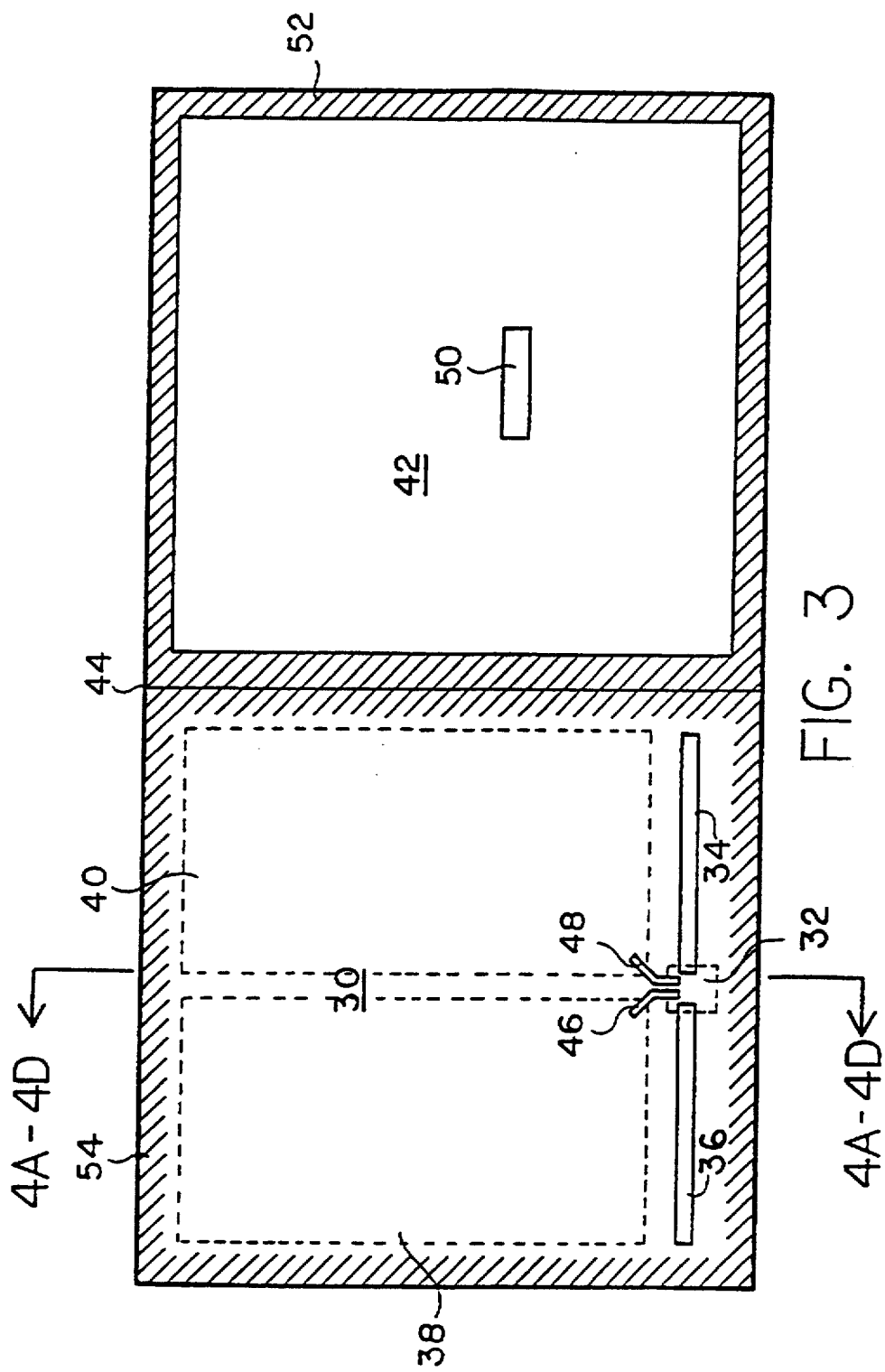
FIG. 3 is a plan view showing the conductive patterns on the base and cover members used in FIG. 2, including dotted line outlines of the locations for the IC and batteries.

FIG. 3 is a plan view showing the conductive patterns on the base and cover members used in FIG. 2, including dotted line outlines of the locations for the IC and batteries. During the initial manufacturing stage for the enclosed transceiver, base 30 and cover 42 are joined at an intersecting line 44. Dipole antenna strips 34 and 36 are shown positioned on each side of IC 32. Two conductive strips 46 and 48 serve to connect the bottoms of batteries 38 and 40 to IC 32. Conductive strip 50 is provided on the upwardly facing inside surface of top cover 42, so that, when cover 42 is folded at intersecting line 44, the outer boundary 52 of cover 42 is ready to be sealed with the outer boundary 54 of base support member 30. Simultaneously, conductive strip 50 bonded by the conductive epoxy to batteries 38 and 40, completes the series electrical connection used to connect batteries 38 and 40 in series with each other and further in series circuit with integrated circuit 32 through conductive strips 46 and 48.

Figure 4A:
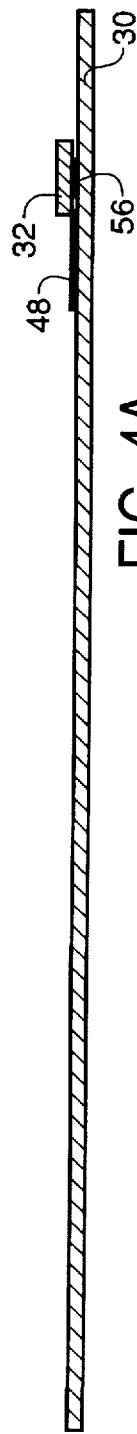
FIG. 4A through FIG. 4D are cross sectional views taken along lines 4—4 of FIG. 3 showing four processing steps used in constructing the enclosed transceiver shown in FIG. 3.

FIG. 4A through FIG. 4D are cross sectional views taken along lines 4—4 of FIG. 3 showing four processing steps used in constructing the enclosed transceiver shown in FIG. 3. FIG. 4A shows in cross sectional view IC 32 bonded to base support member 30 by means of a spot or button of conductive epoxy material 56. Conductive strip 48 is shown in cross section on the upper surface of base support member 30.

Figure 4B:
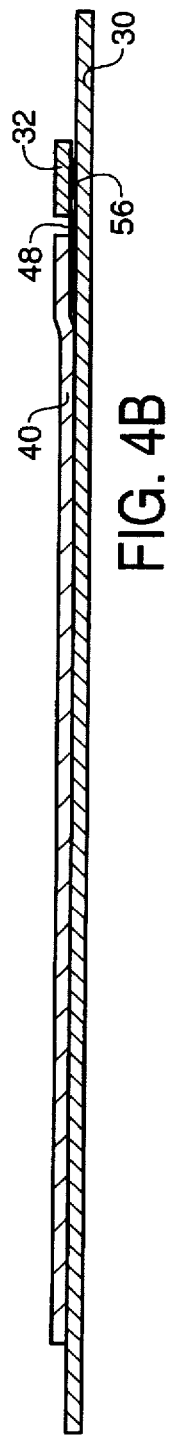

In FIG. 4B, battery 40 is aligned in place as indicated earlier in FIG. 2 and has the right hand end thereof bonded and connected to the upper surface of conductive strip 48 by means of a spot of conductive epoxy applied to the upper surface of conductive strip 48, but not numbered in this figure.

Figure 4C:
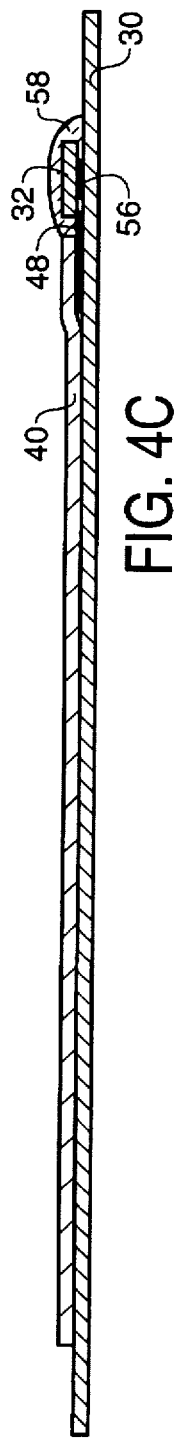
Figure 4D:
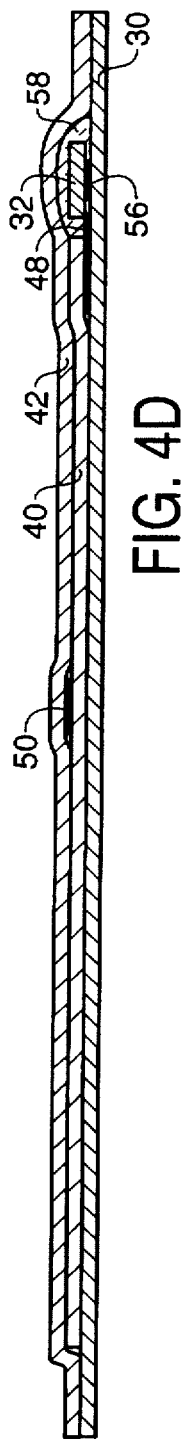

In FIG. 4C, a stiffener material 58 is applied as shown over the upper and side surfaces of IC 32. The stiffener material will preferably be an insulating material such as "glob-top" epoxy to provide a desired degree of stiffness to the package as completed. Next, a spot of conductive epoxy is applied to each end of conductive strip 50, and then cover layer material 42 with the conductive epoxy thereon is folded over onto batteries 38 and 40 and base member 30 to cure and heat seal and, thus, complete and seal the package in the configuration shown in FIG. 4D.

Figure 5A:
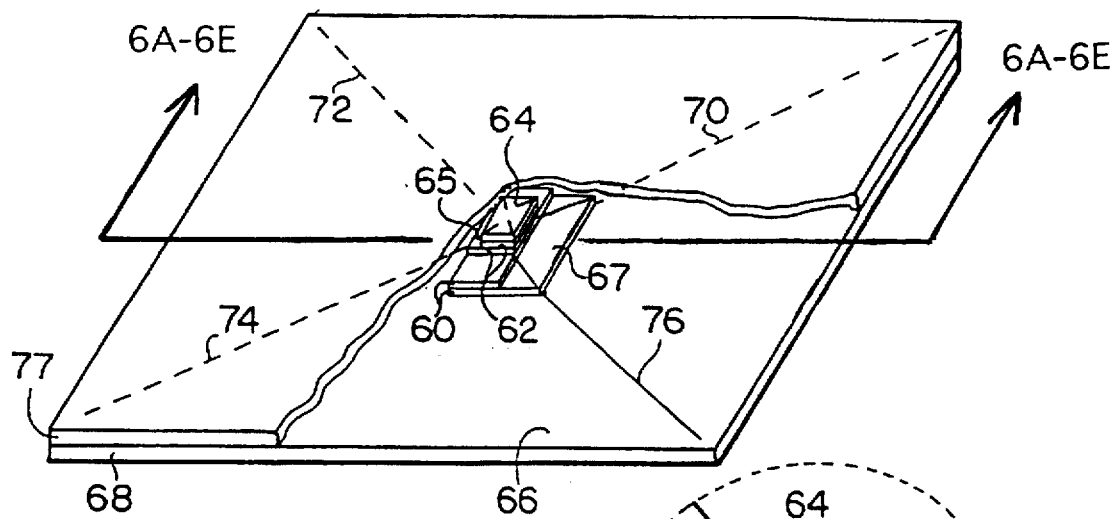
FIG. 5A is a perspective view of an alternate embodiment of the invention wherein the IC is mounted on a parallel plate capacitor which in turn is mounted on a battery.
Figure 5B:
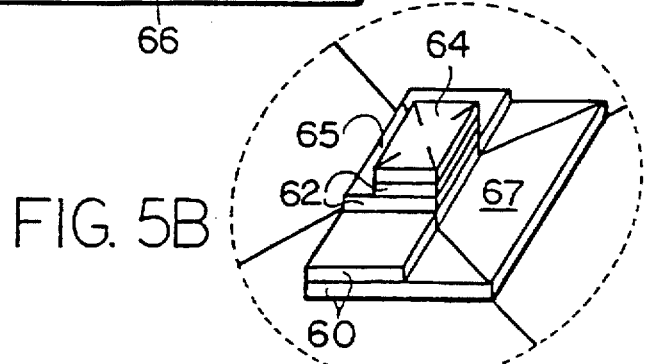
FIG. 5B is an enlarged portion of FIG. 5A.

FIG. 5A is a perspective view of an alternate embodiment of the invention wherein the IC is mounted on a parallel plate capacitor which in turn is mounted on a battery. FIG. 5B is an enlarged portion of FIG. 5A. The enclosed transceiver shown includes the combination of battery 60, capacitor 62, and IC 64. When inrush current requirements for IC 64 exceed the capability of battery 60 to supply surge current, for example, due to inductive coupling or battery structure, inrush current is supplied by capacitor 62. The structure of battery 60 is in direct contact with the upper surface 66 of a base support member 68. The structure of parallel plate capacitor 62 is positioned intermediate to the upper surface of the structure of battery 60 and the bottom surface of IC 64. In order to facilitate making electrical contacts to capacitor 62 and battery 60, respectively, an exposed capacitor bottom plate area 65 is provided on the left hand side of this structure and an exposed battery bottom plate area 67 is provided on the right hand side of the battery-capacitor-chip structure. A plurality of antenna lines 70, 72, 74, and 76 form two dipole antennas connected to opposite corners of IC 64 in a generally X-shaped configuration and extend as shown from IC 64 to the four corners of the package. Upper polymer cover 77 is sealed in place as shown to hermetically seal all of the previously identified elements of the package between base support member 68 and polymer cover 77.

FIG. 6A through FIG. 6E are cross sectional views taken along lines 6—6 of FIG. 5 showing five processing steps used in constructing the embodiment shown in FIG. 5. Base starting material includes a first or base polymer layer 78, such as polyester or polyethylene, which is laminated with a relatively impermeable material such as metal film, PVDC, or silicon nitride. Base layer 78 is coated on the bottom surface thereof with a suitable adhesive film 80 which will be used for the device adhesion during device usage. If the adhesive is sufficiently impermeable, the impermeable coating may be omitted. The battery connection and attachment are made on the upper surface of base layer 78 using a spot of conductive epoxy. Conductive epoxy is also used at interface 94 between battery 60 and capacitor 62 and interface 98 between capacitor 62 and IC 64.

Figure 6A:
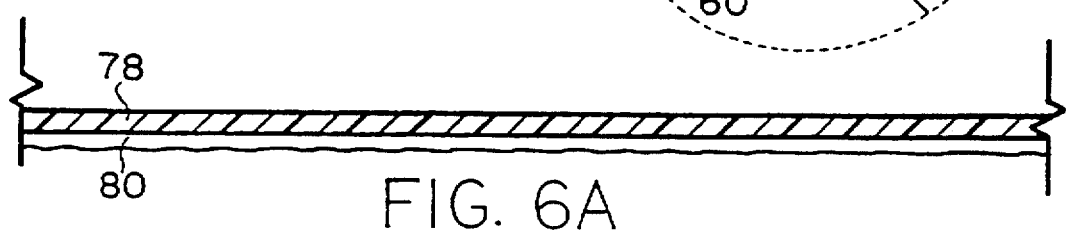
FIG. 6A through FIG. 6E are cross sectional views taken along lines 6—6 of FIG. 5 showing five processing steps used in constructing the embodiment shown in FIG. 5.
Figure 6B:
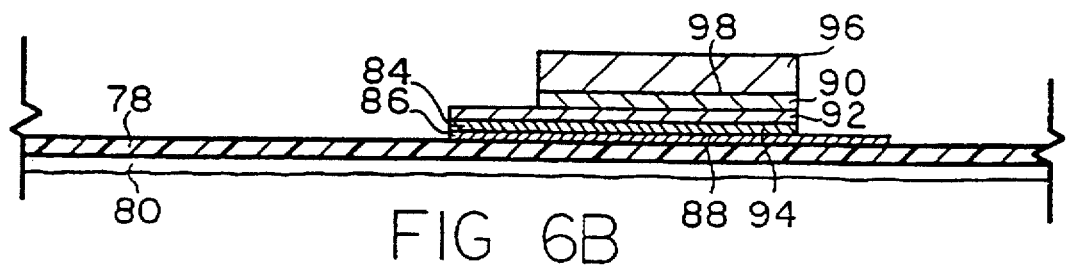

Referring now to FIG. 6B, a thin film battery consisting of parallel plates 84 and 86 is placed on base layer 78. Next, a capacitor comprising parallel plates 90 and 92 is attached onto battery layer 84 using a conductive epoxy. Bottom plate 92 of capacitor 62 is somewhat larger in lateral extent than top capacitor plate 90 in order to facilitate the necessary electrical connection of battery 60 and capacitor 62 to integrated circuit 96. IC 96 corresponds to IC 64 in FIGS. 5A and 5B. IC 96 is then attached to top capacitor plate 90 with a conductive epoxy at interface 98, thereby providing an electrical connection. The bottom surface of IC 96 is metallized to facilitate this connection. In an alternate and equivalent fabrication process, an epoxy cure heat step or metallization anneal step is used to enhance the sealing between the various above stacked elements.

Figure 6C:
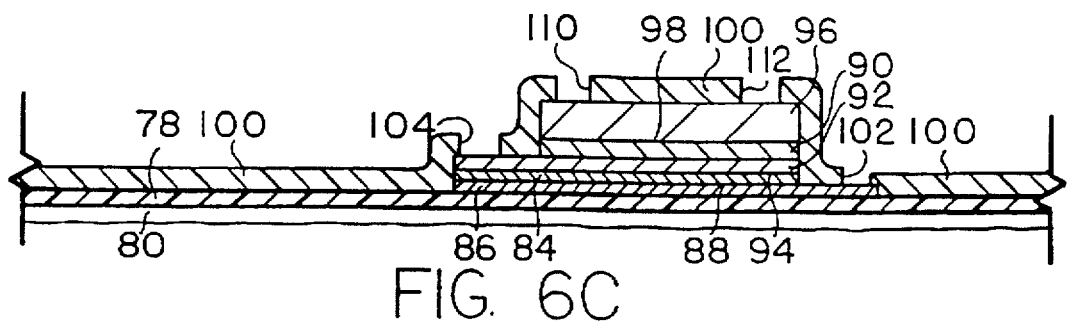

Referring now to FIG. 6C, prefabricated insulating layer 100 is now laid over the battery/capacitor/IC stack in the geometry shown. Layer 100 includes openings 102, 104, 110, and 112 therein for receiving a conductive polymer material as will be described below in the following stage of the process. Prefabricated holes 102, 104, 110, and 112 in layer 100 are aligned, respectively, to the battery contact, to the capacitor contact, and to the contacts on the top of IC 96. Layer 100 is then sealed to base polymer layer 78 using, for example, a conventional heating or adhesive step.

Figure 6D:
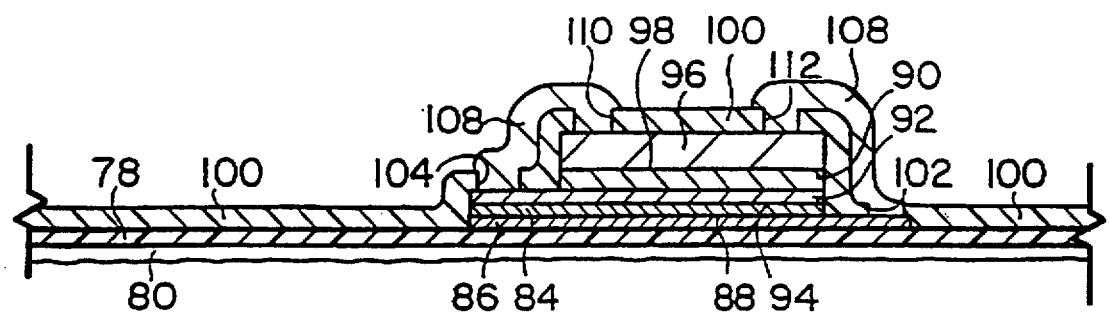
Figure 6E:
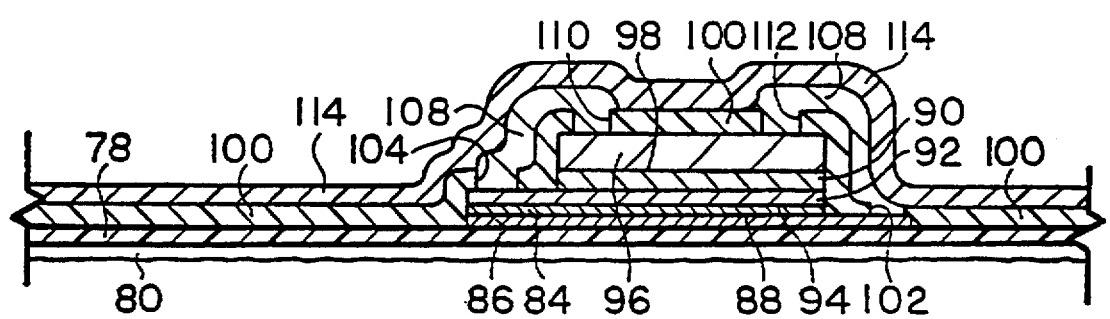

Referring now to FIG. 6D, a conductive polymer material 108 is deposited in openings 102 and 104 in the lower regions of layer 100 and extended up into the upper openings 110 and 112 of layer 100 to make electrical contact as indicated on the upper surface of IC 96. The shaped conductive epoxy material 108 may also be preformed utilizing a stamping tool or silk screening techniques and is applied as shown over the upper surface of layer 100. Conductive epoxy material 108 forms the innermost region of the antenna structure extending from IC 96 out in the dual dipole geometry as previously described with reference to FIGS. 5A and 5B. However, the complete antenna geometry shown in FIG. 5A is outside the lateral bounds of the fragmented cross sectional views shown in FIGS. 6A through 6E. At this point in the process, an epoxy cure heat step is optional.

Referring now to FIG. 5E, polymer insulating layer 114 is formed on the upper surface of layer 100 in the geometry shown and further extends over the exposed upper surfaces of the conductive epoxy polymer antenna material 108. Layer 114 is then sealed to layer 100 using either heat or adhesive sealing. Layer 114 provides a final hermetic seal for the completed device shown in cross section in FIG. 6E.

Figure 7:
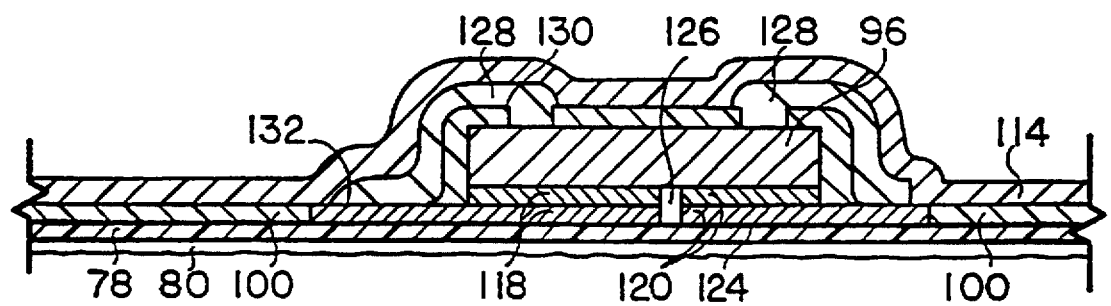
FIG. 7 is a cross-sectional view showing an arrangement of battery and capacitor alternate to the embodiment shown in FIG. 5.

FIG. 7 is a cross-sectional view showing an arrangement of battery and capacitor alternate to the embodiment shown in FIG. 5. As shown in FIG. 7, the battery and capacitor are mounted side-by-side under the IC. The electrical connection for battery 118 and capacitor 120 to integrated circuit 96 is provided by positioning the battery 118 and capacitor 120 in the co-planar configuration shown on the surface of base polymer layer 78. The bottom plate of battery 118 is connected through conductive epoxy layer 128 to the top surface of IC 96. The bottom plate of parallel plate capacitor 120 is connected through conductive epoxy layer 128 to the top surface of the IC 96. A small space 126 is provided as shown to electrically isolate battery 118 and capacitor 120. In addition, in this embodiment of the invention, conductive material 128 is extended as shown between the left side opening 130 in the layer 100 and a lower opening 132 in layer 100. In a manner similar to that described above with reference to FIGS. 6A through 6E, layer 114 is then extended over the top surface of layer 100 in the geometry shown. Conductive polymer material 128 extends to connect the crossed antenna structure of FIG. 5 to IC 96 shown in FIG. 7.

Figure 8:
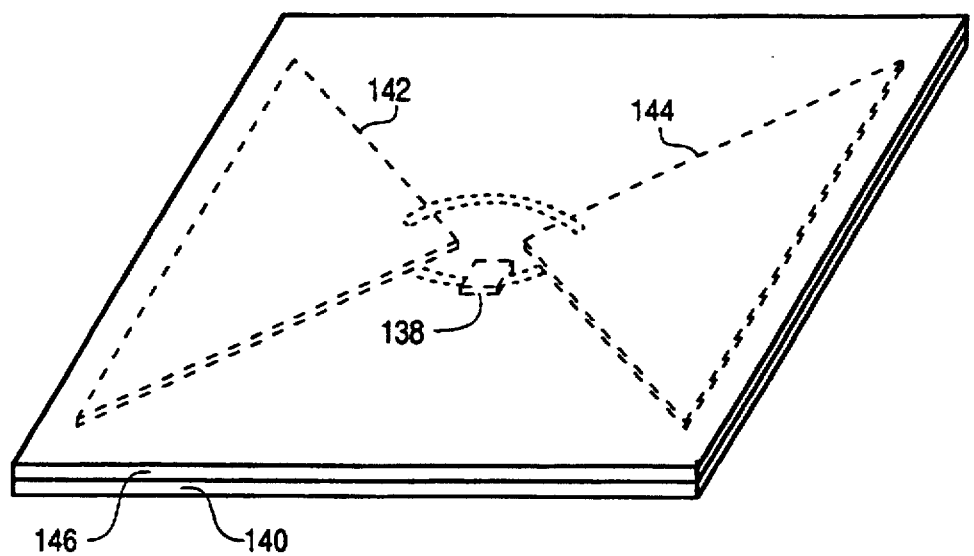
FIG. 8 is a perspective view of another alternate embodiment of the present invention having battery surfaces defining and performing the function of a bow-tie antenna.

FIG. 8 is a perspective view of another alternate embodiment of the present invention having battery surfaces defining and performing the function of a bow-tie antenna. IC 138 is centrally positioned as shown on the upper surface of base support member 140 and is electrically connected to two triangularly shaped batteries 142 and 144, also disposed on the upper surface of base support member 140. Batteries 142 and 144 are connected in series with IC 138 when protective cover member 146 is sealed over the top surfaces of the two batteries 142 and 144 and the IC 138 using processing steps previously described.

In the embodiment of the invention shown in FIG. 8, the entire outer surfaces of the two batteries 142 and 144 serve as a "bow tie" antenna structure for the enclosed transceiver. At communication wavelengths, the top and bottom surfaces of batteries 142 and 144 are coupled together. Batteries 142 and 144 are connected in series with the IC 138 to provide DC operating power therefor in a manner previously described. Moreover, the dual use of the batteries as power supplies and antenna structures minimizes the number of terminals required to connect IC 138 into an enclosed transceiver.

Figure 9:
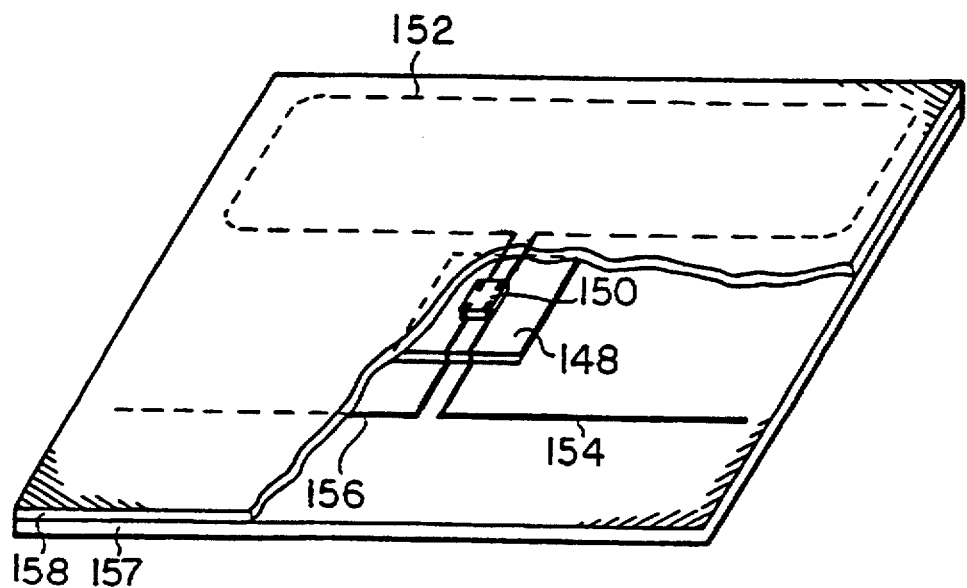
FIG. 9 shows an alternate, passive device embodiment of the present invention in partially cut-away perspective view wherein the battery has been altogether eliminated and further wherein a capacitor is periodically charged from an external source in a manner described below to provide operating power to the IC.

FIG. 9 shows an alternate, passive device embodiment of the present invention in partially cut-away perspective view wherein the battery has been altogether eliminated and further wherein a capacitor is periodically charged from an external source in a manner described below to provide operating power to the IC. This embodiment is known as the passive or battery-less device embodiment, since it contains no battery therein. Instead, operating power is provided by a capacitor structure identified as component 148 located beneath IC 150. A charge on capacitor 148 is maintained by conventional RF charging circuits (not shown) on IC 150 which are energized from a remote source.

The enclosed transceiver shown in FIG. 9 includes a first loop antenna 152 for receiving RF charging signals for capacitor 148 and a dipole antenna formed of conductive strips 154 and 156 for receiving and transmitting data to and from IC 150. As in previous embodiments, capacitor 148 and IC 150 are positioned and hermetically sealed between a base cover member 157 and a top cover member 158.

Figure 10:
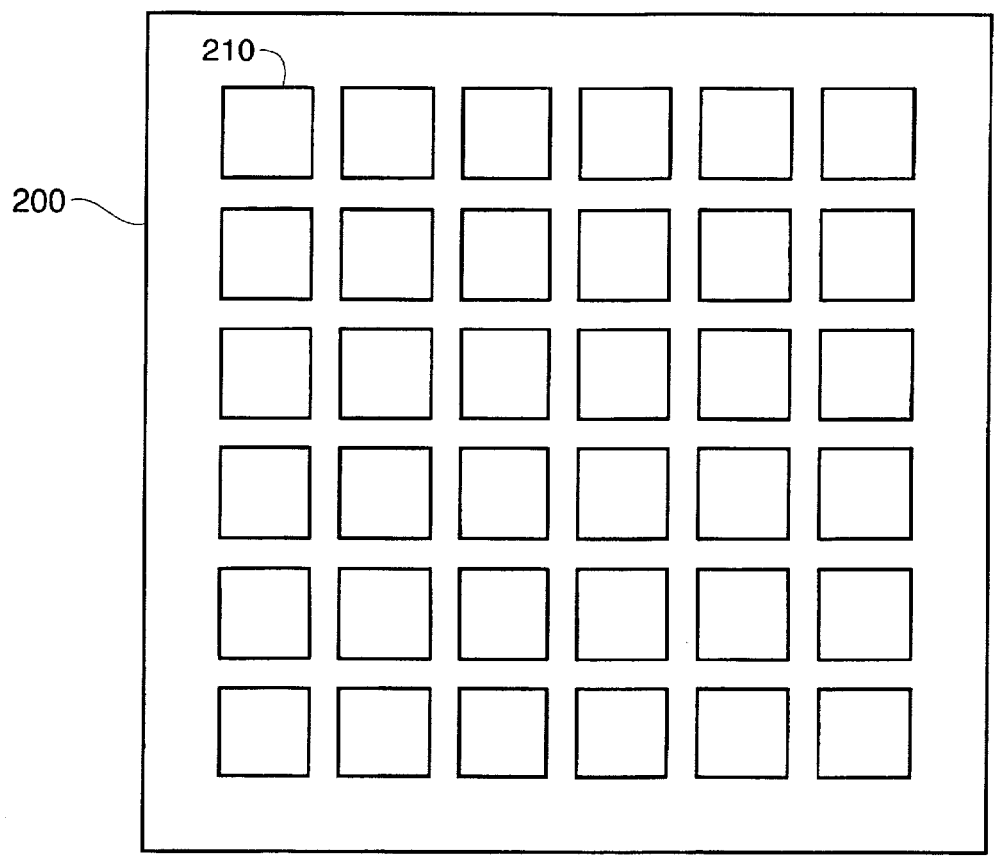
FIG. 10 is a top view of a web of enclosed transceivers of the present invention.

FIG. 10 is a top view of a web of enclosed transceivers of the present invention. Laminated sheet 200 includes 36 enclosed transceivers 210 simultaneously manufactured in a plurality of cavities as already described. Sheet 200 in a preferred embodiment includes 252 enclosed transceivers, each approximately 1.5 inches square. Alternatively, sheet 200 includes one folded film as illustrated in FIGS. 2, 3, and 4; three coextensive films 114, 100, and 78 as illustrated in FIGS. 6 and 7; or two coextensive films as is apparent from FIGS. 8 and 9, and FIGS. 11 and 12 to be discussed below. Sheet 200, in one embodiment is sectioned to obtain individual enclosed transceivers by interstitial cutting, perforation and tearing, or sheering; sectioning being simultaneous with or following the step of sealing each enclosed cavity by lamination, embossing, hot stamping or the like. Alternatively enclosed transceivers are manufactured in a continuous strip, for example, one enclosure.

After manufacturing has been completed, a large number of finished devices, or webs are stored on a take-up reel (not shown) supporting a corresponding large plurality of the devices. Advantageously, storage on a take-up reel not only makes the present process conducive to high speed automated manufacturing, but in addition makes the process compatible to high speed manual or automated product dispensing and use. Large numbers of enclosed transceivers may be supplied easily to a user in a conventional tape and reel format. The user can readily detatch one device at a time for immediate attaching to an article. Alternatively, enclosed transceivers a remanufactured and shipped in sheets and later sectioned by the customer.

In yet another embodiment, devices are cut from the tape or sheet from which they were manufactured and then removably mounted on a backing. The backing in one embodiment is in tape format and in another equivalent embodiment is in sheet format. When mounted to a backing, enclosed transceivers are more effectively stored in a cache for dispensing individually. The cache, not shown, includes means for dispensing (i.e. separately providing a transceiver on demand) and shielding means for preventing signal reception by enclosed transceivers within the cache. If shielding were not included, a supply of transceivers located within communicating range of an interrogator would soon expend battery capacity by processing signals including, for example, wake-up signals. Means for dispensing includes, for example, mechanical devices for feeding a tape or sheet through an opening and mechanical devices for separating shielding materials from a tape or sheet. The former dispensing means, in one embodiment of the cache, cooperates with shielding across the opening including conductive rollers, separating brushes, separating fingers, and the like. The latter dispensing means, in another embodiment of the cache, cooperates with conductive backing material, or conductive foam as a backing or cover layer arranged to shield the exposed edges of a roll containing transceivers.

Figure 11:
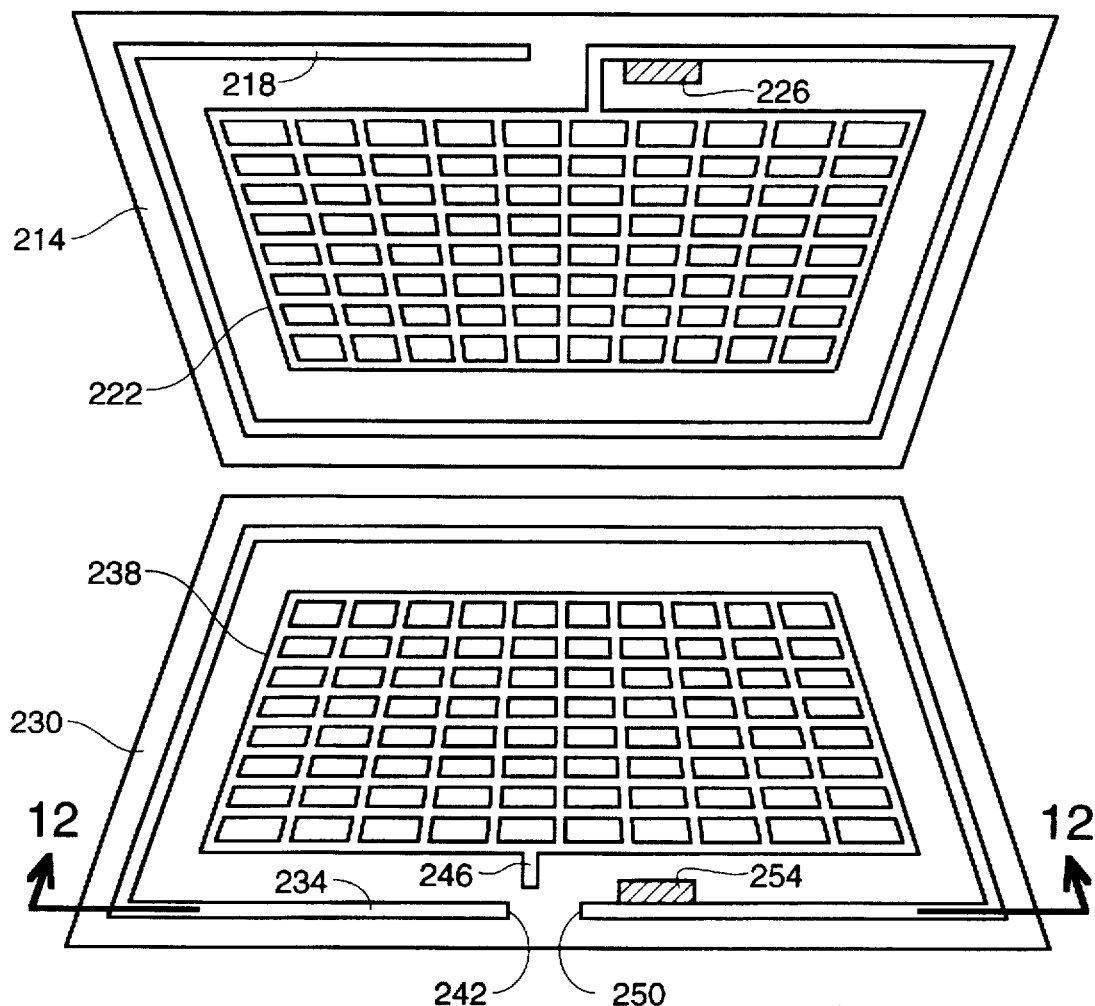
FIG. 11 is an exploded perspective view of the top and bottom films used to construct one of the enclosed transceivers shown in FIG. 10.

FIG. 11 is an exploded perspective view of the top and bottom films used to construct one of the enclosed transceivers shown in FIG. 10. The embodiment shown corresponds to enclosed transceiver 18 shown in FIG. 1B. Top film 214 includes area 222 for lamination onto the top surface (pole) of battery 20; strip 218 for loop antenna 19; and, contact area 226. Each of these three features, in a preferred embodiment, is formed of conductive ink. In an alternate and equivalent embodiment, these three features are formed of conductive epoxy. Bottom film 230 includes area 238 for lamination onto the bottom surface (pole) of battery 20; strip 234 for loop antenna 19; contact area 254; and contact points 242, 246, and 250 for connecting integrated circuit 21 to the battery and antenna. Each of these six features, in a preferred embodiment, is formed of conductive ink, though conductive epoxy is equivalent.

Contact 246 is intentionally misaligned with respect to area 222 to prevent shorting battery 20. However, strips 218 and 234 are aligned to coincide, as are contact areas 226 and 254, respectively. These strips and contact areas when joined by lamination cooperate as means for coupling power from battery 20 to IC 21 and, simultaneously, for electrically matching IC 21 to the communications medium by forming loop antenna 19. Thus, contacts 242, 246, and 250 correspond respectively to lines 24, 23, and 22 shown in FIG. 1B.

Unlike the antenna pattern of the dipole antenna shown in FIGS. 1A, 2, 3, and 9, there is no null in the antenna pattern for loop antenna 19, due in part to the conductive structure of battery 20 being connected to one side of loop antenna 19. The combined loop antenna and battery structure is also preferred over the dipole in that the combination provides an antenna pattern that is less subject to variation over a broad range of frequencies.

Figure 12:
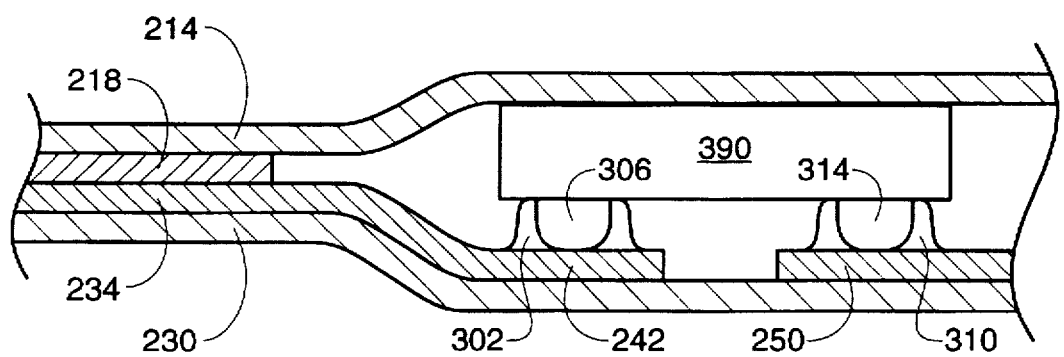
FIG. 12 is a cross-sectional view taken along lines 12—12 of FIG. 11 showing a portion of the web shown in FIG. 10 and illustrating electrical coupling to and between the films.

FIG. 12 is a cross-sectional view taken along lines 12—12 of FIG. 11 showing a portion of the web shown in FIG. 10 and illustrating electrical coupling to and between the films. The completed assembly includes similarly numbered elements already discussed with reference to FIG. 11. IC 390 is prepared for assembly by forming conductive bumps 306 and 314 to terminals on its lower surface. In a preferred embodiment, bumps are formed of conductive epoxy. In an alternate embodiment, metallic bumps, such as gold, are formed by conventional integrated circuit processes. IC 390 as shown is in a "flip chip" packaging orientation having substantially all circuitry formed on the surface facing film 230. Prior to assembly, a puddle of conductive epoxy is applied to contacts 250 and 242. IC 390 is then located atop contacts 250 and 242 so that bumps 306 and 314 are surrounded within puddles 302 and 310. The film is then heated to set all conductive epoxy including puddles 302 and 310, as well as strips and areas including the antenna and contact areas 226 and 254, formed of conductive epoxy. Finally, top film 214 is aligned over bottom film 230 so that contact areas 226 and 254 are pressed together.

Figure 13A:
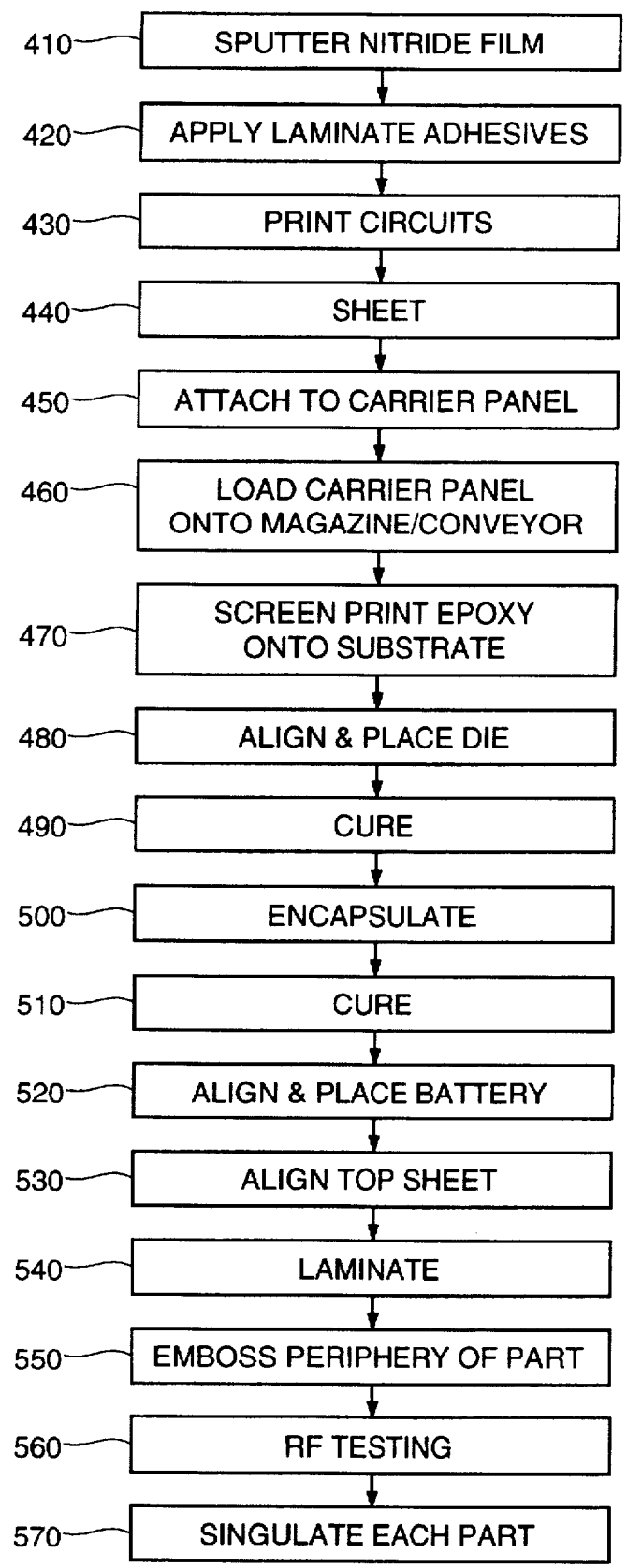
FIG. 13A is a process flow diagram showing the steps of the present invention used to manufacture an enclosed transceiver.

FIG. 13A is a process flow diagram showing the steps of the present invention used to manufacture an enclosed transceiver of the type shown in FIGS. 10–12. The manufacturing process begins with a polyester film used for the bottom and for the top. Material for the bottom in a first embodiment is identical to the top and includes film with dimensional stability, for example, polyester film that has been heat stabilized or pre-shrunk. These materials, though inexpensive, are porous to substances that degrade the life and functions of the battery and integrated circuit. This disadvantage is resolved in a preferred embodiment by coating the outer surfaces of the material used for the top and bottom film with a barrier material In the first step 410, barrier material, such as a silicon nitride deposit, is formed on the outer surface by sputtering, or by chemical vapor deposition (CVD), preferably plasma enhanced CVD. The deposit provides a hermetic barrier to prevent water vapor and other contaminants from affecting (e.g. oxidizing) battery and transceiver components. In a first embodiment the resulting thickness of the deposit is from 400 to 10,000 angstroms. In another embodiment, where thin deposits are desirable, coating on both sides of the film prevents pin holes in each deposit from aligning in a way that defeats hermeticity. The thickness of the deposit and the manner of formation are design choices based on the selection of materials for the film and the deposit, as well as the system requirements for hermeticity over time. For example an alternate and equivalent embodiment uses other barrier materials including silicon oxide and silicon nitride deposited at a thickness of 100 to 400 angstroms. The barrier material is formed in such an embodiment using one of the processes including evaporation deposition, chemical vapor deposition, and plasma enhanced chemical vapor deposition.

In another embodiment of the present invention, a nitride film is sputtered on the outside portion of a top and bottom base support layer. Each base support layer preferably comprises a polymer material such as a polyester film that is laminated with a barrier layer material such as polyethylene and/or polyvinylidenechloride (PVDC). Formation of the barrier material deposit can be deferred until the enclosed transceiver is encapsulated, provided that environmental concerns such as contamination, over heating, and changes in pressure are addressed.

In step 420, a laminate adhesive is applied to the inner surfaces of the top and bottom films. The laminate adhesive is activated in a later manufacturing step to cause the top and bottom layers to adhere. Preferably, the adhesive is tack free at room temperature and selected to match laminating equipment heat and pressure capabilities. In a preferred embodiment, butyl acrylate is extruded onto the films to cover the entire inside surface of each film. In another embodiment, the adhesive is screen printed for economy.

In step 430, conductors are screen printed onto the films. In a preferred embodiment, the conductors are formed on top of laminate adhesive. Areas such as grid conductors 222 and 238 shown in FIG. 11 for contacting the battery are, consequently, interspersed with areas of exposed laminate adhesive to provide a more durable enclosure. In this embodiment, a polymer thick film ink is employed. High conductivity is provided by such inks that include copper or silver constituents. The ink preferably provides a stable surface for electrical butt contact formations. A low oxidation rate at storage temperature is desirable, though oxidation could be minimal in a controlled manufacturing environment.

Printed circuits on the top layer are arranged to perform multiple functions when the top and bottom layers are joined. First, a conductor on the top layer completes series or parallel circuits for devices having contacts in two planes. Conductor 50 in FIG. 2 is one example. Second, a conductor on the top layer completes an antenna structure for the transceiver integrated circuit, as illustrated in FIG. 8. Third, a single conductor in the top layer accomplishes both the first and second functions. See, for example, the conductor in FIG. 11 identified as areas 226, 222, and 218.

In an alternate embodiment, conductors are formed in a subtractive process, for example, chemical etching. By using a positive screen print process, energy and material are conserved. Printed circuit technology is applied in another embodiment wherein the step of attaching the integrated circuit and the battery to a base material includes soldering and brazing. The base material in such an embodiment is one of a wide variety of printed circuit materials including polyimide and glass-epoxy materials.

In step 440, the top and bottom base support layers are cut from the roll or web to form sheets as illustrated in FIG. 10 to facilitate use of automated component placement machinery. Each sheet is attached, in step 450, to a carrier panel for compatibility with conveyor based manufacturing facilities.

At step 460, a carrier with sheet attached is loaded into a magazine or placed onto a conveyor for automated manufacturing. Steps 440–460, in an alternate embodiment of the manufacturing process of the present invention, are omitted as unnecessary when continuous manufacturing from roll stock is desirable.

In step 470, those portions of conductors that are to make electrical contact with the integrated circuit are prepared with a coating or puddle of conductive epoxy. In a preferred embodiment, silver filled epoxy is employed that remains wet at room temperature until thermally cured. Application of the epoxy is by screen printing. In an alternate embodiment, epoxy is applied by dispensing.

In step 480, integrated circuit die are placed so that epoxy bumps previously formed on the integrated circuit enter the puddles formed in step seven. The arrangement of the integrated circuit face down on the bottom film is commonly referred to as "flip-chip" orientation. In an alternate and equivalent embodiment, integrated circuits are also placed in contact puddles formed on the top, i.e. cover layer. All die on the sheet are placed and aligned in this step 480 prior to proceeding with subsequent cure.

In step 490, a batch of panels is heated to set the epoxy applied in step seven. In an alternate embodiment, a conveyor based oven supports continuous curing. Curing temperature and duration are design choices that match the epoxy curing requirements. In a preferred embodiment, curing is performed at 150 degrees Celsius for 3 to 5 minutes. The cure is selected so as not to interfere with the characteristics of the laminate adhesive applied in step 420.

In step 500, an encapsulation material, commonly called "glob top epoxy" is applied over the integrated circuit. Suitable nonconductive materials include those providing a stiffening property to protect the integrated circuit and the electrical connections thereto from mechanical damage.

In step 510, the encapsulating material is cured. In a preferred embodiment, the encapsulating material is cured with ultraviolet radiation. An alternate and equivalent embodiment, employs a thermal curing process. The ultraviolet cure is preferred for rapid manufacturing. However, use of a thermal cure in step 510 may permit use of a partial thermal cure in step 490, later perfected by additional thermal cure duration provided in step 510.

In step 520, the battery or batteries are aligned and placed on the base support film. In an embodiment including stacked battery cells, connection is made using conductive tape having adhesive on both sides of the tape. Such tape commonly includes conductive particles in the adhesive.

In step 530, the top or cover film is aligned over the bottom or base film. In an embodiment including a folded film, the top film is folded over the base film. In an alternate embodiment employing continuous manufacturing from roll stock, the base film and top film are aligned for continuous lamination.

In step 540, the top cover film is pressed onto the bottom base film and heat is applied to activate the adhesive applied in step 420. For butyl acrylate adhesive a temperature of from 95 to 110 degrees Celsius is preferred.

In applications where the transceiver is to be used in harsh environments, the seal provided by automated lamination equipment may be incomplete or have weaknesses caused, for example, by insufficient heat or pressure at a point in an area to be sealed. Enclosing components of varying thicknesses can result in air pockets surrounding such components that, if too near the periphery, can also lead to weaknesses and voids. In such applications, the preferred process includes step 550 wherein the periphery of each transceiver on a sheet is subject to a second application of heat and pressure for activating laminate adhesive applied in step 420. The additional heat and pressure in such a localized periphery can deform the films to form minute bosses. Thus, the step is called embossing. The aspect of the effective application of heat and pressure is more important than the extent of consequential deformation.

In an alternate embodiment, each enclosure is evacuated. Lamination for such an embodiment is conducted in an evacuated environment. Embossing in yet another embodiment is also conducted in an evacuated environment.

After step 540, the circuitry of the battery powered transceiver is active by virtue of the completed circuits formed when the top cover layer is aligned and butt contacts are formed with components and the base layer. Functional tests of multiple or individual transceivers are now feasible.

In step 560, transceivers are functionally tested. To prevent interference between tests of individual transceivers, a pair of grounded plates with surface features are placed on both sides of a sheet of enclosed transceivers so that each transceiver operates inside a shielded cavity. The wavelength used for testing is selected such that leakage through the thickness of the embossed seal is negligible. Plates similar to the embossing die used in step 550 are used in one embodiment. Each cavity includes an antenna for transmitting stimulus signals and for receiving response signals for measuring the quality of each transceiver. Measurements include, for example, receiver sensitivity, transmitted spectrum, message handling capability, self-testing, and response timing.

In step 570, the sheet of tested transceivers is sheered in two dimensions to singulate or separate the transceivers from one another. In an alternate and equivalent embodiment, a backing material is applied to one side of the sheet prior to singulation. Singulation for this embodiment is accomplished by kiss cutting through the top and base films leaving the transceivers attached to the backing material. Transceivers, whether attached to the backing or loose are then sorted based on the results of functional testing performed in step 560 and additional testing as needed.

Figure 13B:
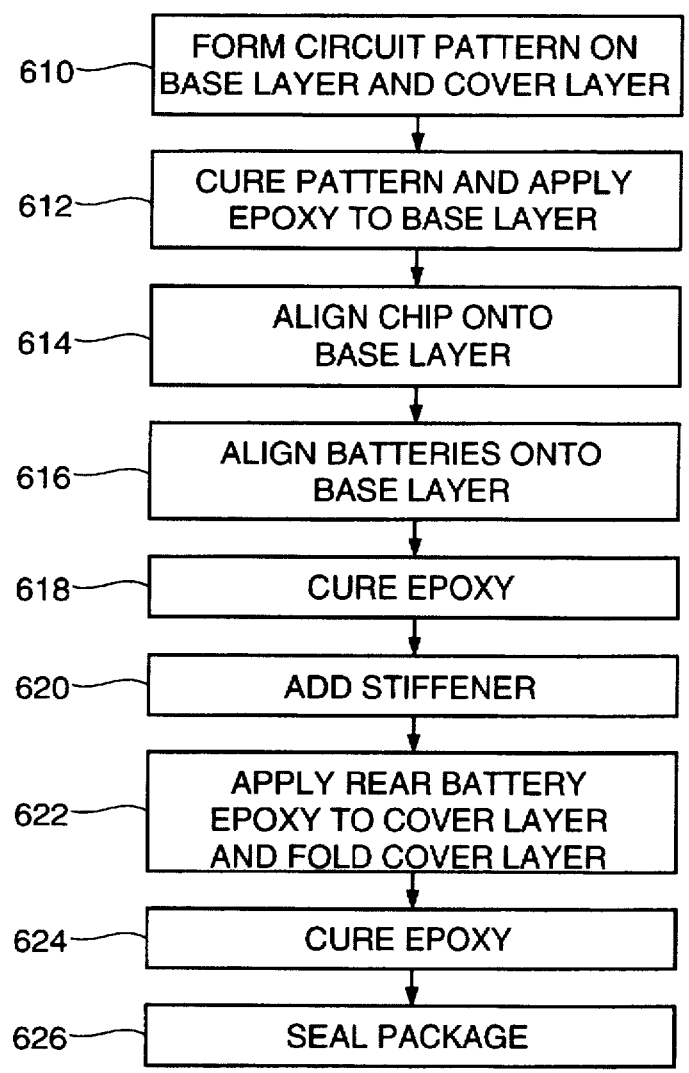
FIG. 13B is a process flow diagram showing the steps of the present invention used to manufacture another enclosed transceiver.

FIG. 13B is a process flow diagram showing the steps of the present invention used to manufacture another enclosed transceiver of the types shown in FIGS. 2–9. This embodiment of the method of the present invention includes nine (9) processing steps or fabrication stages which are used in the overall manufacturing process and in the construction of an enclosed transceiver.

In one embodiment the nine steps are performed sequentially as follows. In step 610, a circuit pattern is initially formed on a base layer material. This base layer material is preferably a polymer such as a polyester film that is laminated with a barrier layer material such as polyethylene and/or polyvinylidenechloride (PVDC). In step 612, the circuit pattern is cured and a conductive epoxy material is applied. In step 614 an integrated circuit chip is aligned onto the base layer. In step 616, two (2) batteries are aligned onto the base layer. In an alternate enclosed transceiver, the batteries are stacked vertically in either a series or parallel electrical connection. In step 618, the epoxy applied in step 612 is cured. In step 620, a stiffener material is applied. In step 622 epoxy is applied to the top surface of the battery and then the top half of the base layer is folded over the bottom half so that the top half forms the top cover. In step 624, the epoxy material applied in step 622 is cured. Finally, in step 626, the package is sealed to complete manufacturing of the package.

Various modifications may be made in and to the above described embodiments without departing from the spirit and scope of this invention. For example, various modifications and changes may be made in the antenna configurations, battery arrangements (such as battery stacking), device materials, device fabrication steps, and the functional block diagrams without departing from the scope of this invention. The various off-chip components such as the antenna, battery, and capacitor are manufactured on-chip in alternate and equivalent embodiments. As a second example, the antenna in another alternate and equivalent embodiment is formed on the outer surface or within the outer film. In such an arrangement, coupling to the antenna is through the capacitance of the outer film as a dielectric. When formed on the exterior, the material comprising the antenna also provides hermeticity to the film for protecting the enclosed transceiver. Accordingly, these and equivalent structural modifications are within the scope of the following appended claims.

As previously suggested, an enclosed transceiver used as an RFID device has utility directed to a wide variety of applications including, but not limited to, airline baggage (luggage, freight, and mail); parcel post (Federal Express and United Parcel Service); U.S. Mail; manufacturing; inventory; personnel security.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art, upon reference to this description without departing from the spirit of the invention, as recited in the claims appended hereto. It is therefore contemplated that the appended claims will cover any such modifications or embodiments as fall within the true scope of the invention.

The words and phrases used in the claims are intended to be broadly construed. A "sticker" refers generally to a label, tag, marker, stamp, identifier, packing slip, invoice, package seal, tape, band, clasp, medallion, emblem, shield, and escutcheon regardless of printed or handwritten material thereon. Mechanical coupling of a "sticker" so defined to an article, person, plant, or animal is not restricted to adhesive but is intended to broadly include all forms of fastening, tieing, and securing.

What is claimed is:

1. A method of manufacturing a radio frequency identification (RFID) transceiver, comprising the steps of:

providing two covers, each cover being composed of a sheet of polymer film;

depositing on each of the two covers a barrier material which is a barrier to water vapor;

mounting an RFID transceiver circuit and a battery between the two covers; and sealing the two covers together along a peripheral contour which completely encircles the transceiver and battery;

whereby the barrier material protects the battery and transceiver from contamination.

2. A method according to claim 1, further comprising the step of mounting between the two covers an antenna connected to the RFID transceiver.

3. A method according to claim 1, wherein the depositing step comprises depositing the barrier material by sputter deposition, chemical vapor deposition, or evaporation deposition.

4. A method according to claim 1, wherein the depositing step comprises depositing as the barrier material a substance from the set consisting of silicon oxide and silicon nitride.

5. A method according to claim 1, wherein the depositing step comprises depositing as the barrier material a substance from the set consisting of polyethylene and polyvinylidenechloride (PVDC).

6. A method according to claim 1, wherein the depositing step comprises depositing as the barrier material a fluorohalocarbon.

7. A method according to claim 6, wherein the fluorohalocarbon is perchlorotetrafluoroethylene.

8. A method according to claim 1, wherein the depositing step comprises depositing the barrier material in a thickness of 400 to 10,000 angstroms.

9. A method according to claim 1, wherein the depositing step comprises depositing the barrier material on both sides of at least one of the two covers.

10. A method according to claim 9, wherein the depositing step further comprises depositing the barrier material on said both sides in a thickness of 100 to 400 angstroms.

* * * * *